(12) United States Patent
Takaoka et al.

(10) Patent No.: US 8,920,580 B2
(45) Date of Patent: *Dec. 30, 2014

(54) SOLDER PASTE AND ELECTRONIC DEVICE

(75) Inventors: Hidekiyo Takaoka, Omihachiman (JP); Kosuke Nakano, Kusatsu (JP)

(73) Assignee: Murata Manufacturing Co., Ltd., Nagaokakyo-Shi, Kyoto-fu (JP)

(*) Notice: Subject to any disclaimer, the term of this patent is extended or adjusted under 35 U.S.C. 154(b) by 1352 days.

This patent is subject to a terminal disclaimer.

(21) Appl. No.: 11/812,005

(22) Filed: Jun. 14, 2007

(65) Prior Publication Data

US 2007/0245852 A1    Oct. 25, 2007

Related U.S. Application Data

(63) Continuation of application No. PCT/JP2005/022380, filed on Dec. 6, 2005.

(30) Foreign Application Priority Data

Jan. 11, 2005  (JP) ................. 2005-003380

(51) Int. Cl.
    *B23K 35/34*    (2006.01)

(52) U.S. Cl.
    USPC ............................................. 148/23; 75/255

(58) Field of Classification Search
    USPC ........ 420/561, 560; 174/260; 148/23; 75/255
    IPC ................. B23K 35/24; B22F 1/0059
    See application file for complete search history.

(56) References Cited

U.S. PATENT DOCUMENTS

| | | | |
|---|---|---|---|
| 5,976,628 A * | 11/1999 | Kawahara et al. | 427/383.1 |
| 2002/0012608 A1* | 1/2002 | Takaoka et al. | 420/561 |
| 2003/0066681 A1* | 4/2003 | Uchida et al. | 174/260 |

FOREIGN PATENT DOCUMENTS

| | | |
|---|---|---|
| JP | 63-168292 | 7/1988 |
| JP | 8-141780 | 6/1996 |
| JP | 9-314377 | 12/1997 |
| JP | 11-347784 A | 12/1999 |
| JP | 2002-254194 | 9/2002 |
| JP | 2002-254194 A | 9/2002 |
| JP | 2003-211289 A | 7/2003 |
| JP | 3558063 | 5/2004 |

OTHER PUBLICATIONS

Written Opinion of the International Searching Authority dated Feb. 28, 2006.

* cited by examiner

*Primary Examiner* — Weiping Zhu
(74) *Attorney, Agent, or Firm* — Dickstein Shapiro LLP

(57) ABSTRACT

In solder paste of the present invention, a first metal powder, a second metal powder, and a third metal powder are dispersed in a flux or a thermosetting resin. The first metal powder includes a first metal material such as Cu, Ag, Au, or Pd that serves as a base metal. A second metal material such as Sn or In that has a melting point lower than that of the first metal material is coated on the surface of the first metal material. The second metal powder is made of a metal material such as Sn or In that has a melting point lower than that of the first metal material. The third metal powder such as a Cu, Ag, Au or Pd powder has an average particle diameter smaller than that of the first metal material and can form compounds with the second metal material and the second metal powder. Accordingly, the likelihood of unreacted components remaining after a heat treatment can be suppressed, and even when a reflow treatment is repeated a plurality of times, a decrease in the bonding strength of solder bonding can be prevented.

20 Claims, 4 Drawing Sheets

PRIOR ART

SOLDER PASTE AND ELECTRONIC DEVICE

This is a continuation of application Ser. No. PCT/JP2005/022380, filed Dec. 6, 2005.

TECHNICAL FIELD

The present invention relates to solder paste and an electronic device, and in particular, to Pb-free solder paste and an electronic device produced using the same.

BACKGROUND ART

Recently, solder materials that do not contain Pb, such as Sn—Cu eutectic solder and Sn—Ag eutectic solder, have been actively developed so as to replace known Sn—Pb solder as a solder material used for mounting electronic components, in consideration of the environment.

For example, Patent Document 1 discloses solder including Cu balls and Sn balls wherein a compound containing $Cu_6Sn_5$ is formed by the Sn balls and some of the Cu balls at a temperature equal to or higher than the melting point of Sn, and the Cu balls are bonded to each other by the compound containing $Cu_6Sn_5$.

Patent Document 1 discloses Sn—Cu eutectic solder paste in which a first metal powder 104 prepared by forming a Sn film 103 on the surfaces of Cu balls (powder) 102 by plating and Sn balls (powder) 105 are dispersed in a flux 106, as shown in FIG. 6.

According to Patent Document 1, and as shown in FIG. 7, solder paste 101 is applied on a conductive part of a printed circuit board 107, and a chip-type electronic component 108 such as a monolithic ceramic capacitor is then mounted thereon. When a reflow treatment is then performed at a temperature of 250° C. or higher, the Sn component (derived from the plated films and the Sn powder) is melted. The Cu balls 102 is wetted and dispersed in the molten Sn component, and the Cu balls 102 is uniformly diffused in the flux 106 to form an intermetallic compound 109 composed of $Cu_6Sn_5$, as shown in FIG. 8. Accordingly, the printed circuit board 107 and the electronic component 108 are electrically bonded, with solder 110 therebetween.

Patent Document 1: Japanese Patent No. 3558063

DISCLOSURE OF INVENTION

Problems to be Solved by the Invention

In Patent Document 1, the Cu balls 105 must be wetted and dispersed in the molten Sn component in order to uniformly diffuse the Cu powder 102 in the flux 106. In order to achieve this, it is effective that the thickness of the Sn film 103 is increased or the amount of Sn balls 105 is increased, thereby increasing the content of the Sn component.

However, when the content of the Sn component is increased, a part of the Sn component does not form the intermetallic compound 109 and may remain as an unreacted Sn 111 in the solder 110 even when a heat treatment (reflow treatment) is performed, as shown in FIG. 9.

When the printed circuit board 107 and the chip-type electronic component 108 are bonded with solder by performing a reflow treatment, the reflow treatment is often repeated a plurality of times. For example, a first reflow treatment is performed when a specific chip-type electronic component 108 is mounted on the printed circuit board 107. Subsequently, a second reflow treatment is performed when another chip-type electronic component is mounted near the specific chip-type electronic component 108.

An intermetallic compound is formed by a heat treatment of Sn—Cu eutectic solder paste. This intermetallic compound is mainly composed of a compound represented by $Cu_6Sn_5$, and a compound represented by $Cu_3Sn$ is formed near the Cu balls (Cu powder). The melting point of $Cu_6Sn_5$ is about 400° C., and the melting point of $Cu_3Sn$ is about 670° C. Thus, these melting points are relatively high. In contrast, the melting point of Sn is low, about 250° C.

Therefore, when a large amount of unreacted Sn component remains after the first reflow treatment and the second reflow treatment is then performed at a temperature of 250° C., which is the melting point of the Sn component, or higher, the unreacted Sn 111 in the solder bonded by the first reflow treatment is again melted. As a result, the bonding strength between the printed circuit board 107 and the chip-type electronic component 108, which were bonded by the first reflow treatment, is decreased.

The present invention has been conceived in view of the above situation. It is an object of the present invention to provide solder paste wherein the likelihood of an unreacted component remaining after a heat treatment can be suppressed, and accordingly, even when a reflow treatment is repeated a plurality of times, a decrease in the bonding strength of the solder bonding can be prevented, and an electronic device produced using this solder paste.

Means for Solving the Problems

To achieve the above object, the present inventors have conducted intensive studies and found a solder paste containing not only a first metal powder in which a plated film having a melting point lower than that of a base metal is formed on the surface of the base metal and a second metal powder having a melting point lower than that of the base metal, but also a third metal powder that has an average particle diameter smaller than that of the base metal and that can form compounds with the plated film and the second metal powder. In this case, the likelihood of a specific component remaining in solder can be suppressed, even when a heat treatment is performed, and a desired intermetallic compound can be formed. Accordingly, even when a reflow treatment is repeated a plurality of times, a decrease in the bonding strength of the solder bonding can be prevented.

The present invention has been achieved on the basis of the above finding. A solder paste according to the present invention contains a first metal powder which includes a first metal material serving as a base metal and in which a second metal material having a melting point lower than the melting point of the first metal material is coated on the surface of the first metal material; a second metal powder made of a metal material having a melting point lower than the melting point of the first metal material; and a third metal powder which has an average particle diameter smaller than the average particle diameter of the first metal material and which can form compounds with the second metal material and the second metal powder.

In the solder paste of the present invention, the first metal material and the third metal powder may contain at least one element selected from among Cu, Ag, Au and Pd, and the second metal material and the second metal powder may contain at least one element from among Sn and In.

The smaller the average particle diameter of the third metal powder, the larger the surface area of the third metal powder. Consequently, the third metal powder is in contact with a large amount of the second metal material and the second metal powder, and this is effective for accelerating reactions. To achieve this, the average particle diameter of the third metal powder is preferably in the range of 0.01 to 0.3 μm.

In the solder paste of the present invention, the first metal material and the third metal powder may be composed of the same material.

Furthermore, the second metal material and the second metal powder may be composed of the same material in the solder paste of the present invention.

In the solder paste of the present invention, the first metal powder, the second metal powder and the third metal powder may be dispersed in a flux.

In addition, as a result of further intensive study, the present inventors have found that when a thermosetting resin is used instead of the flux, the solder layer in a soldered portion is coated with a resin film. Accordingly, the generation of voids or the like can be further suppressed. As a result, physical bonding strength can be improved without additionally sealing the soldered portion with a resin.

Accordingly, the first metal powder, the second metal powder, and the third metal powder may be dispersed in a thermosetting resin in the solder paste of the present invention.

In an electronic device according to the present invention, a first electronic component is electrically connected to a second electronic component with a soldered portion therebetween, the soldered portion being formed by heating the above-described solder paste.

Advantages of the Invention

The above-described solder paste contains a first metal powder, a second metal powder and a third metal powder. The first metal powder includes a first metal material such as Cu (melting point: 1,083° C.), Ag (melting point: 961° C.), Au (melting point: 1,064° C.) or Pd (melting point: 1,554° C.) that serves as a base metal. A second metal material such as Sn (melting point: 231° C.) or In (melting point: 156° C.) that has a melting point lower than that of the first metal material is coated on the surface of the first metal material. The second metal powder is made of a metal material such as Sn or In that has a melting point lower than that of the first metal material. The third metal powder, such as a Cu, Ag, Au, or Pd powder, has an average particle diameter smaller than that of the first metal material and can form compounds with the second metal material and the second metal powder. Accordingly, the third metal powder having an average particle diameter smaller than that of the first metal material is in contact with the second metal material and the second metal powder, to wet and disperse the base metal, even when the contents of the metal components, such as the second metal material and the second metal powder, which are melted during heating are increased, thereby accelerating the reaction between the second metal material and the third metal powder and the reaction between the second metal powder and the third metal powder. Consequently, the likelihood of unreacted metal components remaining in the solder can be suppressed, thereby improving the bonding strength of the solder bonding.

In the solder paste, the third metal powder is composed of small particles having an average particle diameter in the range of 0.01 to 0.3 μm. Accordingly, the surface area of the total third metal powder is increased, and the third metal powder is effectively in contact with larger amounts of the second metal material and the second metal powder, thereby accelerating the reactions. Consequently, the bonding strength is also further improved.

Since the first metal powder, the second metal powder, and the third metal powder are dispersed in a flux, the above-described desired operations and advantages can be achieved in the solder paste of the present invention.

When the first metal powder, the second metal powder, and the third metal powder are dispersed in a thermosetting resin in the solder paste of the present invention, since the soldered portion is covered with the thermosetting resin. Accordingly, the generation of voids or the like can be further suppressed. In addition, physical bonding strength can be improved without additionally sealing the soldered portion with a resin. Accordingly, solder paste that is suitable for the production of an electronic device having satisfactory mass-productivity and excellent reliability can be realized.

In the electronic device of the present invention, a first electronic component is electrically connected to a second electronic component with a soldered portion therebetween, the soldered portion being formed by heating the above-described solder paste. Therefore, the likelihood of unreacted metal components remaining in the solder can be suppressed. Even when a reflow treatment is repeated a plurality of times, the bonding strength of the solder bonding is not degraded. When the solder paste prepared by dispersing the first to third metal powders in a thermosetting resin is used, the soldered portion is composed of a solder layer coated with a resin film. In this case, physical bonding strength can be particularly improved without additionally sealing the soldered portion with a resin. Accordingly, an electronic device having satisfactory mass-productivity and excellent reliability can be produced.

Figure 1:
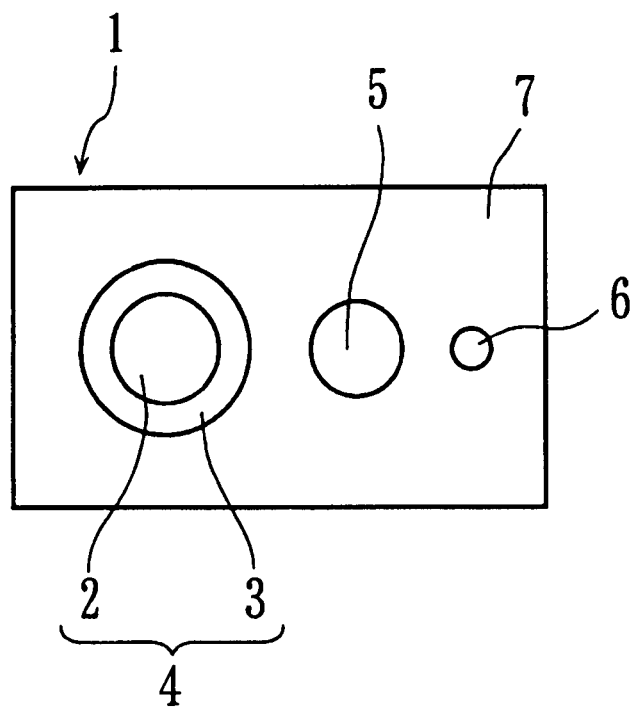
FIG. 1 is a plan view that schematically shows solder paste according to a first embodiment of the present invention.

REFERENCE NUMERALS 2 first metal material
3 second metal material
4 first metal powder
5 second metal powder
6 third metal powder
7 flux
8 first electronic component 9 second electronic component
10 soldered portion
12 thermosetting resin
15 soldered portion

BEST MODE FOR CARRYING OUT THE
INVENTION

Embodiments of the present invention will now be described in detail.

FIG. 1 is a plan view that schematically shows a solder paste according to a first embodiment of the present invention. Solder paste 1 includes a first metal powder 4, a second metal powder 5, and a third metal powder 6. The first metal powder 4 is composed of a first metal material 2 serving as a base metal, and a second metal material 3 that has a melting point lower than that of the first metal material 2 and that is coated on the surface of the first metal material 2. The second metal powder 5 is made of a metal material having a melting point lower than that of the first metal material 2. The third metal powder 6 has an average particle diameter smaller than that of the first metal material 2. Furthermore, the third metal powder 6 can form compounds with the second metal material 3 and the second metal powder 5. The first metal powder 4, the second metal powder 5 and the third metal powder 6 are dispersed in a flux 7.

When the solder paste is subjected to a heat treatment, the first metal material 2 is combined with the second metal material 3 to form an intermetallic compound having a melting point higher than that of the first metal material 2, the second metal powder 5 is combined with the first metal material 2 to form an intermetallic compound having a melting point higher than that of the second metal powder 5, and the third metal powder 6 is combined with the second metal material 3 and the second metal powder 5 to form an intermetallic compound having a melting point higher than that of the second metal powder 5.

In the known solder paste containing only the first metal powder 4 and the second metal powder 5 described above, when a heat treatment is performed, the first metal material 2 is combined with the second metal material 3 to form an intermetallic compound having a melting point higher than that of the first metal material 2, and the second metal powder 5 is combined with the first metal material 2 to form an intermetallic compound having a melting point higher than that of the second metal powder 5.

As described in the Problems to be Solved by the Invention section, it is effective that the film thickness of the second metal material 3 is increased or the amount of the second metal powder 5 is increased in order to wet and disperse the molten metal components. However, in such a case, a part of the second metal material 3 and the second metal powder 5 may remain as unreacted metal components in the solder.

The melting points of the second metal material 3 and the second metal powder 5 are lower than those of the intermetallic compounds to be formed. Accordingly, when reflow heating is performed a plurality of times during mounting of electronic components, the second metal material 3 and the second metal powder 5 that remain as the unreacted metal components in the solder may be melted again by reheating. As a result, the bonding strength of the mounted components may be decreased.

In this embodiment, however, the solder paste 1 contains a third metal powder 6 that has an average particle diameter smaller than that of the first metal material 2 and that can form compounds with the second metal material 3 and the second metal powder 5. Accordingly, the likelihood of the unreacted metal components remaining is suppressed.

More specifically, the third metal powder 6 is brought into contact with the second metal material 3 and the second metal powder 5 so as to effectively accelerate reactions by adding a third metal powder 6 having an average particle diameter smaller than that of the first metal material 2. Accordingly, even when the contents of the second metal material 3 and the second metal powder 5 are increased, the likelihood of the unreacted components remaining can be suppressed. Consequently, even when a reflow treatment is performed a plurality of times, a decrease in the bonding strength at a portion bonded using a previous reflow treatment can be prevented.

The smaller the particle diameter of the third metal powder 6, the larger the surface area of the powder. Accordingly, the probability of contacting the second metal material 3 and the second metal powder 5 is increased, thereby accelerating the reactions resulting in the formation of the compounds. Therefore, the particle diameter of the third metal powder 6 is preferably as small as possible. More specifically, the average particle diameter of the third metal powder 6 is preferably in the range of 0.01 to 0.3 μm.

The first metal material 2 used as the base metal may be a metal element or an alloy such as a Cu—Ni alloy which contains at least one element selected from among Cu, Ag, Au and Pd and which is suitable for use in a Pb-free solder material.

The second metal material 3 is a metal material having a melting point lower than that of the first metal material 2. For example, a metal element or an alloy which contains at least one of Sn and In can be used as the second metal material 3.

The second metal powder 5, as in the second metal material 3, is made of a metal material having a melting point lower than that of the first metal material 2. For example, a metal element or an alloy which contains at least one of Sn and In can be used as the second metal powder 5.

Tin (Sn) can be used as the second metal material 3, and indium (In) can be used as the second metal powder 5. Alternatively, In may be used as the second metal material 3, and Sn may be used as the second metal powder 5. However, considering the strength against thermal shock in portions bonded to a mounted component, the second metal powder 5 is preferably made of the same metal as the second metal material 3. For example, when Sn is used as the second metal material 3, Sn is also preferably used as the second metal powder 5. When In is used as the second metal material 3, In is also preferably used as the second metal powder 5.

The third metal powder 6 is made of a metal material which can form compounds with the second metal material 3 and the second metal powder 5. For example, the third metal powder 6 may be made of Cu, Ag, Au or Pd, or an alloy containing these metal elements. The material of the third metal powder 6 is not necessarily the same as the first metal material 2. However, as in the above case, considering the strength against thermal shock in portions bonded to a mounted component, the third metal powder 6 is preferably made of the same metal as the first metal material 2. For example, when Cu is used as the first metal material 2, Cu is also preferably used as the third metal powder 6. When Ag is used as the first metal material 2, Ag is also preferably used as the third metal powder 6.

Figure 2:
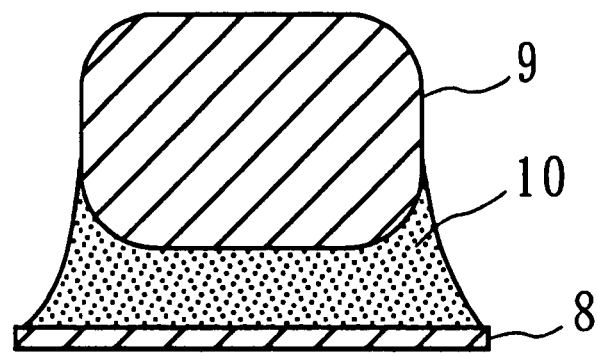
FIG. 2 is a cross-sectional view showing an embodiment of an electronic device produced using the solder paste according to the first embodiment.

FIG. 2 is a cross-sectional view that schematically shows an embodiment of an electronic device mounted using the above solder paste. A first electronic component 8 such as a printed circuit board is electrically bonded to a second electronic component 9 such as a monolithic ceramic capacitor with a soldered portion 10 therebetween.

This electronic device is produced as follows.

Figure 3:
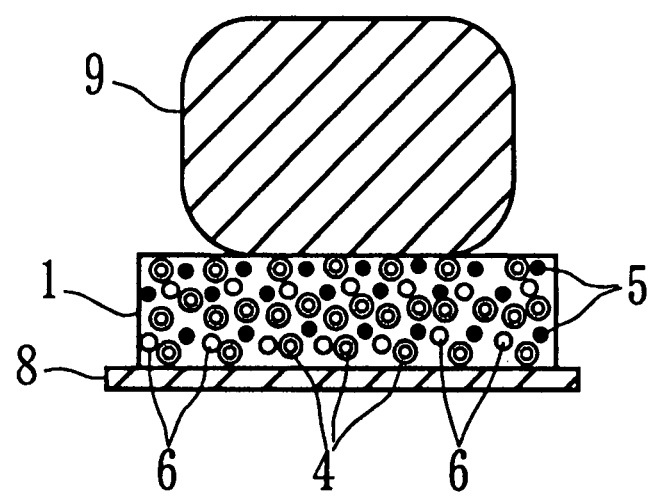
FIG. 3 is a cross-sectional view showing a state in which solder paste is applied on a first electronic component and a second electronic component is mounted on the solder paste.

As shown in FIG. 3, the solder paste 1 is applied on the first electronic component 8, and the second electronic component 9 is then mounted on the solder paste 1. Subsequently, when a heat treatment is performed at a predetermined temperature, the first metal material 2 is combined with the second metal material 3 and the second metal powder 5, and the third metal powder 6 is combined with the second metal material 3 and the second metal powder 5. As shown in FIG. 2, a soldered portion 10 containing an intermetallic compound is formed. That is, the first electronic component 8 is bonded to the second electronic component 9 with the soldered portion 10 therebetween. Accordingly, the first electronic component 8 is electrically connected to the second electronic component 9, thereby producing the electronic device.

In the electronic device thus produced, the solder paste contains the third metal powder that has an average particle diameter smaller than that of the first metal material 2 and that can form compounds with the second metal material 3 and the second metal powder 5. Therefore, even when the contents of the second metal material 3 and the second metal powder 5 are increased, the second metal material 3 and the second metal powder 5 are combined with the third metal powder 6 by the reflow treatment (heat treatment) to form an intermetallic compound. Accordingly, the likelihood of unreacted metal components remaining can be suppressed. Therefore, the bonding strength is not decreased even when a reflow treatment is repeated a plurality of times.

Figure 4:
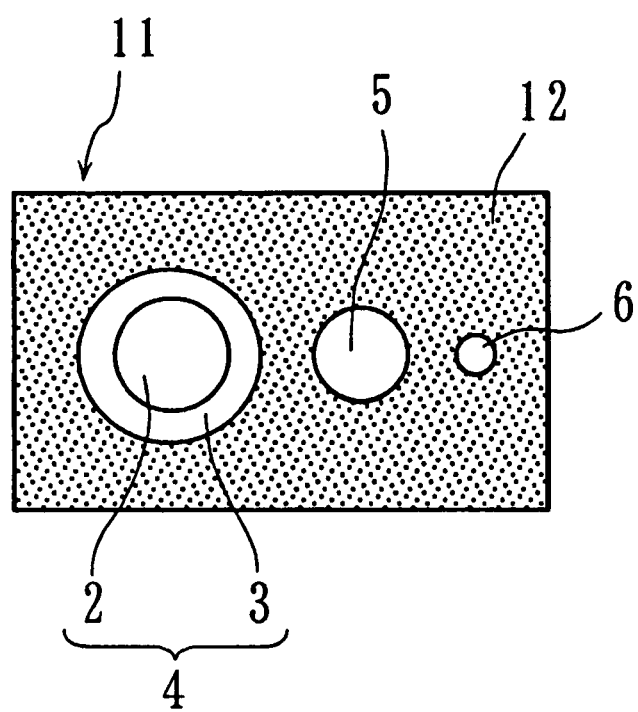
FIG. 4 is a plan view that schematically shows solder paste according to a second embodiment of the present invention.

FIG. 4 is a plan view that schematically shows a solder paste according to a second embodiment of the present invention. In solder paste 11, the first to third metal powders 4 to 6 are dispersed in a thermosetting resin 12 instead of a flux.

Figure 5:
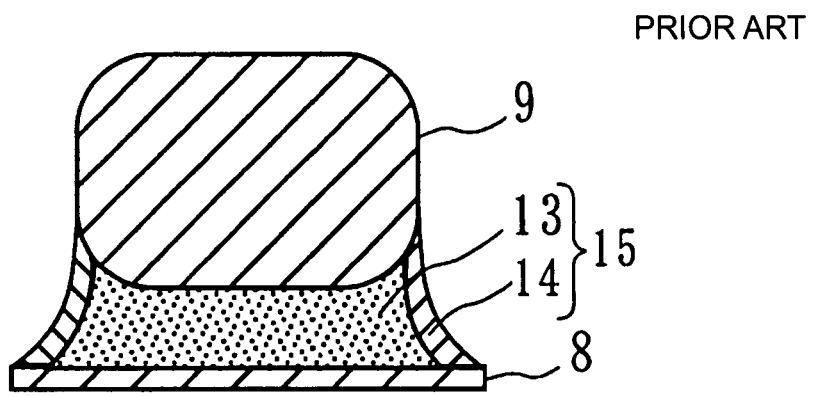
FIG. 5 is a cross-sectional view showing an embodiment of an electronic device produced using the solder paste according to the second embodiment.
Figure 6:
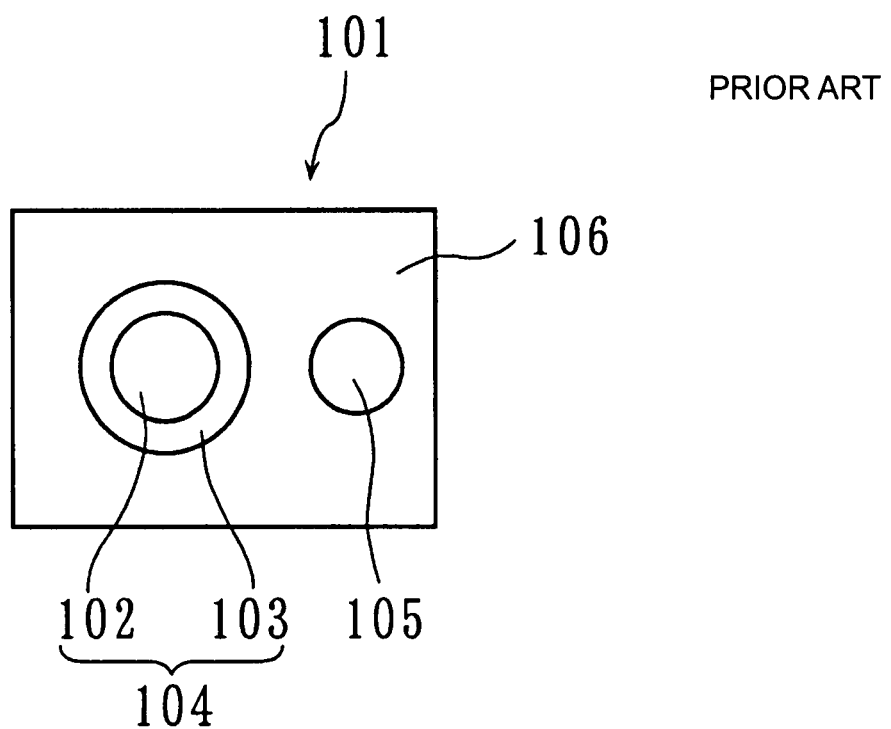
FIG. 6 is a plan view that schematically shows known solder paste.
Figure 7:
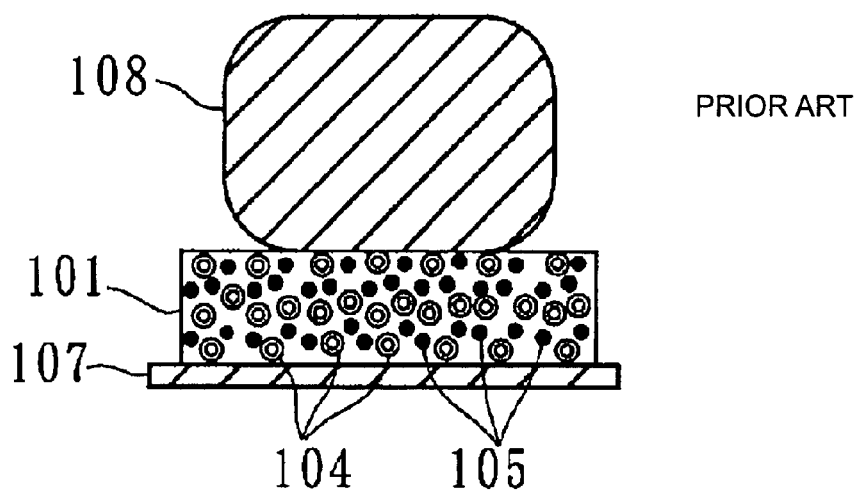
FIG. 7 is a cross-sectional view showing a state in which the known solder paste is applied on a first electronic component and a second electronic component is mounted on the solder paste.
Figure 8:
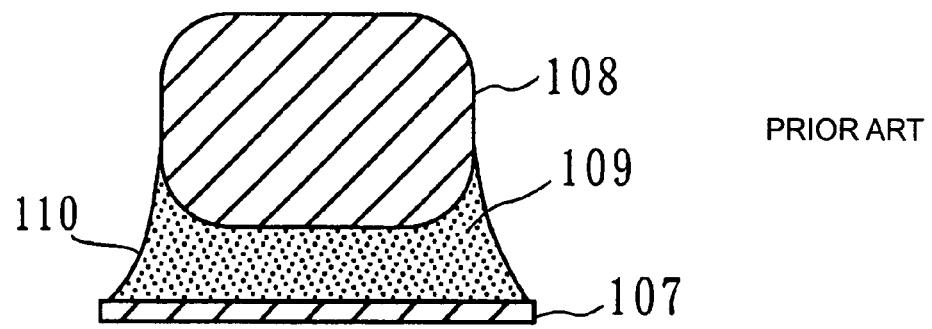
FIG. 8 is a cross-sectional view of an electronic device produced using the known solder paste.
Figure 9:
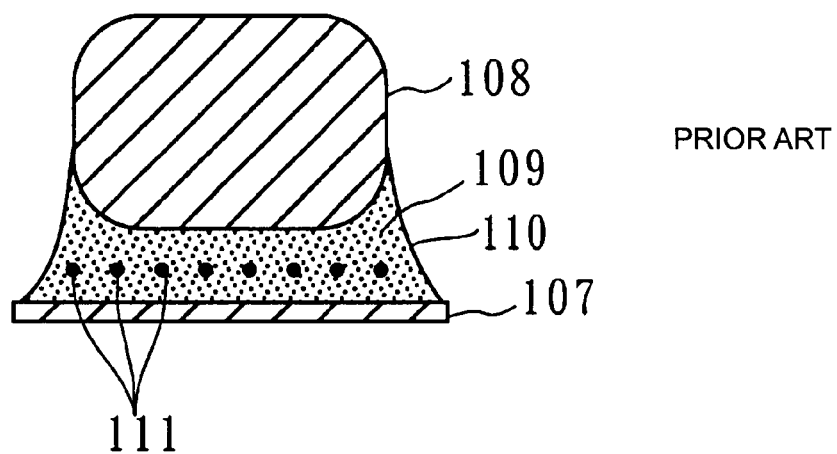
FIG. 9 is a view illustrating a problem that is caused when an electronic device is produced using the known solder paste.

As in the first embodiment, the solder paste 11 is applied on the first electronic component 8 and the second electronic component 9 is then mounted on the solder paste 11. Subsequently, when a heat treatment is performed at a predetermined temperature, the first metal material 2 is combined with the second metal material 3 and the second metal powder 5, and the third metal powder 6 is combined with the second metal material 3 and the second metal powder 5. As shown in FIG. 5, a solder layer 13 is formed, and the surface of the solder layer 13 is covered with the thermosetting resin forming a resin film 14. The solder layer 13 and the resin film 14 form a soldered portion 15.

In this second embodiment, as described above, a solder paste prepared by dispersing the first to third metal powders 4 to 6 in the thermosetting resin 12 is used. As a result, a soldered portion 15 in which the resin film 14 is disposed on the surface of the solder layer 13 is formed. Accordingly, even when a reflow treatment is repeated a plurality of times, a desired heat resistance can be ensured without degrading the bonding strength. In addition, the generation of voids or the like can be suppressed, and physical bonding strength, and particular, the bonding strength in the horizontal direction, can be further improved. Furthermore, the solder layer 13 need not be additionally sealed with a resin. Accordingly, the production process of the electronic device can be simplified, and a process suitable for mass-productivity can be achieved.

It is to be understood that the present invention is not limited to the above embodiments and various modifications may be made without departing from the essence of the present invention. The method of coating the second metal material 3 on the surface of the first metal material 2 is not particularly limited. The second metal material 3 can be coated on the surface of the first metal material 2 by a method of forming a film by plating or another precipitation method.

Examples of the present invention will now be described specifically.

FIRST EXAMPLE

A Cu powder (hereinafter referred to as "base Cu metal") (melting point: 1,083° C.) having an average particle diameter of 1 μm was prepared as a first metal material used as a base metal. Electroless Sn plating or electroless In plating was then performed on the base Cu metal. A Sn film or an In film (a second metal material) having a thickness of 0.05 μm was formed on the surface of the base Cu metal by this electroless Sn plating or electroless In plating, thus preparing a first metal powder.

Subsequently, a Sn powder (melting point: 231° C.) or an In powder (melting point: 156° C.) having an average particle diameter of 1 μm was prepared as a second metal powder. A Cu powder having an average particle diameter of 0.01 μm was prepared as a third metal powder.

Furthermore, a flux containing 76 weight percent of rosin, 22 weight percent of diethylene glycol diethyl ether, and 2 weight percent of triethanolamine was prepared.

Subsequently, predetermined amounts of the first metal powder, the second metal powder (the Sn powder or the In powder), and the third metal powder (the Cu powder) were obtained. These powders were then dispersed in the flux using a three-roll mill, thereby preparing solder paste samples of Examples 1 to 6.

Furthermore, predetermined amounts of the first metal powder and the second metal powder (the Sn powder or the In powder) were obtained. These powders were then dispersed in the flux as in Examples 1 to 6, thereby preparing solder paste samples of Comparative Examples 1 and 2 that did not contain the Cu powder (the third metal powder). In Comparative Example 1, a powder prepared by forming a Sn film on the surface of the base Cu metal was used as the first metal powder. In Comparative Example 2, a powder prepared by forming an In film on the surface of the base Cu metal was used as the first metal powder.

Each of the solder paste samples of Examples 1 to 6 and Comparative Examples 1 and 2 was printed on a copper plate having a length of 30 mm and a width of 30 mm via a metal mask. A monolithic ceramic capacitor having a length of 1.0 mm, a width of 0.5 mm and a thickness of 0.5 mm was then mounted on the copper plate. A reflow treatment was then performed in air for five minutes at a maximum temperature of 280° C., thereby bonding the copper plate to the monolithic ceramic capacitor with the solder.

Subsequently, 30 mg of the solder in the bonded portion was sampled. The melting behavior of the solder was measured with a differential scanning calorimeter (DSC). The presence or absence of unreacted Sn or unreacted In was confirmed by checking whether a Sn endothermic peak (melting point of Sn: 231° C.) was observed or not.

Table 1 shows the component compositions of the solder paste samples of Examples 1 to 6 and Comparative Examples 1 and 2, and the presence or absence of unreacted Sn in the solder paste samples.

TABLE 1

| | | First metal powder (wt %) | | Second metal powder (wt %) | | Third metal powder (wt %) | Flux (wt %) | Unreacted Sn or unreacted In |
|---|---|---|---|---|---|---|---|---|
| | | Base metal (First metal material) | Second metal material | | | | | |
| | | Cu | Sn | In | Sn | In | Cu | | |
| Example | 1 | 56.7 | 8.3 | — | 5.0 | — | 10.0 | 20.0 | Not observed |
| | 2 | 48.0 | 7.0 | — | 5.0 | — | 20.0 | 20.0 | Not observed |
| | 3 | 39.2 | 5.8 | — | 5.0 | — | 30.0 | 20.0 | Not observed |
| | 4 | 56.7 | — | 8.3 | — | 5.0 | 10.0 | 20.0 | Not observed |
| | 5 | 48.0 | — | 7.0 | — | 5.0 | 20.0 | 20.0 | Not observed |
| | 6 | 39.2 | — | 5.8 | — | 5.0 | 30.0 | 20.0 | Not observed |
| Comparative Example | 1 | 65.4 | 9.6 | — | 5.0 | — | — | 20.0 | Observed |
| | 2 | 65.4 | — | 9.6 | — | 5.0 | — | 20.0 | Observed |

As is apparent from Table 1, these results showed that since the solder paste samples of Comparative Examples 1 and 2 did not contain the Cu powder (the third metal powder), unreacted Sn or unreacted In remained after the reflow treatment.

In contrast, it was confirmed that since the solder paste samples of Examples 1 to 6 contained, as the third metal powder, the Cu powder having an average particle diameter (0.01 μm) smaller than that (1 μm) of the base Cu metal, unreacted Sn or unreacted In did not remain after the reflow treatment.

SECOND EXAMPLE

A base Cu metal having an average particle diameter of 1 μm and a Ag powder (hereinafter referred to as "base Ag metal") (melting point: 961° C.) having an average particle diameter of 1 μm were prepared as a first metal material used as a base metal. Electroless Sn plating (Examples 11 to 13 and Examples 17 to 19) or electroless In plating (Examples 14 to 16 and Examples 20 to 22) was then performed on the base Cu metal or the base Ag metal. A Sn film or an In film (a second metal material) having a thickness of 0.05 μm was formed on the surface of the base Cu metal or the base Ag metal by this electroless Sn plating or electroless In plating, thus preparing a first metal powder.

Subsequently, as in First Example, a second metal powder (a Cu powder or an In powder) having an average particle diameter of 1 μm, and Cu powders having an average particle diameter of 0.01, 0.10, or 0.30 μm were prepared. The first metal powder, the second metal powder, one of the Cu powders (a third metal powder), and a flux were prepared so as to have the same mixing ratio as that in Example 1 shown in Table 1. Thus, solder paste samples of Examples 11 to 22 were prepared.

Furthermore, solder paste samples of Comparative Examples 11 to 22 were prepared by the same method and procedure as those in Examples 11 to 22 except that a Cu powder having the same average particle diameter (1 μm) as that of the base Cu metal was used as the third metal powder.

Subsequently, a monolithic ceramic capacitor was bonded on a copper plate with the solder by the same method and procedure as those in First Example. The solder in the bonded portion was sampled, and the presence or absence of unreacted Sn or unreacted In was confirmed.

Table 2 shows the average particle diameters of the base metal (the first metal powder), the second metal powder, and the third metal powder, and the presence or absence of unreacted Sn or unreacted In of Examples 11 to 22 and Comparative Examples 11 to 22.

TABLE 2

| | | Average particle diameter of base metal (first metal powder) (μm) | | Average particle diameter of second metal powder (μm) | | Average particle diameter of third metal powder (μm) | Unreacted Sn or unreacted |
|---|---|---|---|---|---|---|---|
| | | Cu | Ag | Sn | In | Cu | In |
| Example | 11 | 1.0 | — | 1.0 | — | 0.01 | Not observed |
| | 12 | 1.0 | — | 1.0 | — | 0.10 | Not observed |
| | 13 | 1.0 | — | 1.0 | — | 0.30 | Not observed |
| | 14 | 1.0 | — | — | 1.0 | 0.01 | Not observed |
| | 15 | 1.0 | — | — | 1.0 | 0.10 | Not observed |
| | 16 | 1.0 | — | — | 1.0 | 0.30 | Not observed |
| | 17 | — | 1.0 | 1.0 | — | 0.01 | Not observed |
| | 18 | — | 1.0 | 1.0 | — | 0.10 | Not observed |
| | 19 | — | 1.0 | 1.0 | — | 0.30 | Not observed |
| | 20 | — | 1.0 | — | 1.0 | 0.01 | Not observed |
| | 21 | — | 1.0 | — | 1.0 | 0.10 | Not observed |
| | 22 | — | 1.0 | — | 1.0 | 0.30 | Not observed |
| Comparative Example | 11 | 1.0 | — | 1.0 | — | 1.00 | Observed |
| | 12 | 1.0 | — | 1.0 | — | 1.00 | Observed |
| | 13 | 1.0 | — | 1.0 | — | 1.00 | Observed |
| | 14 | 1.0 | — | — | 1.0 | 1.00 | Observed |
| | 15 | 1.0 | — | — | 1.0 | 1.00 | Observed |
| | 16 | 1.0 | — | — | 1.0 | 1.00 | Observed |
| | 17 | — | 1.0 | 1.0 | — | 1.00 | Observed |
| | 18 | — | 1.0 | 1.0 | — | 1.00 | Observed |
| | 19 | — | 1.0 | 1.0 | — | 1.00 | Observed |
| | 20 | — | 1.0 | — | 1.0 | 1.00 | Observed |
| | 21 | — | 1.0 | — | 1.0 | 1.00 | Observed |
| | 22 | — | 1.0 | — | 1.0 | 1.00 | Observed |

As is apparent from Table 2 since the average particle diameter of the Cu powder used as the third metal powder was 1 μm in Comparative Examples 11 to 16, which was the same as the average particle diameter of the base Cu metal, unreacted Sn or unreacted In remained after the reflow treatment.

In Comparative Examples 17 to 22, as in Comparative Examples 11 to 16, the average particle diameter of the Cu powder used as the third metal powder was 1 μm, which was the same as the average particle diameter of the base Ag metal, and unreacted Sn or unreacted In remained after the reflow treatment.

In contrast, the Cu powders having an average particle diameter in the range of 0.01 to 0.30 μm, which was smaller than the average particle diameter (1 μm) of the base Cu metal or the base Ag metal, were used in Examples 11 to 22 as the third metal powder. Accordingly, unreacted Sn or unreacted In did not remain after the reflow treatment.

THIRD EXAMPLE

Solder paste samples having the mixing ratios shown in Examples 31 to 48 in Table 3 were prepared by the same procedure as that in First Example except for the following. A base Ag metal (melting point: 961° C.), a Au powder (hereinafter referred to as "base Au metal") (melting point: 1,064° C.), and a Pd powder (hereinafter referred to as "base Pd metal") (melting point: 1,554° C.) each having an average particle diameter of 1 μm were used as the first metal material. In addition, a Ag powder, a Au powder, and a Pd powder each having an average particle diameter of 0.01 μm were used as the third metal powder.

Further, predetermined amounts of the first metal powder and the second metal powder were obtained and then dispersed in a flux, thus preparing solder paste samples of Comparative Examples 31 and 36 that did not contain the third metal powder.

Subsequently, a monolithic ceramic capacitor was bonded on a copper plate with the solder by the same method and procedure as those in First Example. The solder in the bonded portion was sampled, and the presence or absence of unreacted Sn or unreacted In was confirmed.

Table 3 shows the component compositions of the solder paste samples of Examples 31 to 48 and Comparative Examples 31 to 36, and the presence or absence of unreacted Sn or unreacted In in the solder paste samples.

As is apparent from Table 3, these results showed that since the solder paste samples of Comparative Examples 31 to 36 did not contain the third metal powder, unreacted Sn or unreacted In remained after the reflow treatment.

In contrast, the Ag powders, the Au powders, or the Pd powders that had the predetermined particle diameter were used as the base metal and the third metal powder in Examples 31 to 48. In these, as in the cases where the Cu powders were used as the base metal and the third metal powder, it was confirmed that unreacted Sn or unreacted In did not remain after the reflow treatment.

FOURTH EXAMPLE

Solder paste samples of Examples 51 to 56 were prepared by the same procedure and method as those in First Example except for the following. A Cu—Ni alloy (Ni: 70 weight percent), a Ag—Cu alloy (Cu: 10 weight percent) and a Ag—Pd alloy (Pd: 30 weight percent) (hereinafter generically referred to as "base alloy") each having an average particle diameter of 1 μm were used as the first metal material. The content of the base alloy was 58.6 weight percent, and the content of the Sn film or the In film was 6.4 weight percent. In addition, the content of the second metal powder (the Sn powder or the In powder) having an average particle diameter of 1 μm was 5.0 weight percent, and the content of the Cu powder having an average particle diameter of 0.01 μm and used as the third metal powder was 10 weight percent.

Subsequently, a monolithic ceramic capacitor was bonded on a copper plate with the solder by the same method and procedure as those in First Example. The solder in the bonded portion was sampled, and the presence or absence of unreacted Sn or unreacted In was confirmed.

Table 4 shows the component compositions of the solder paste samples of Examples 51 to 56, and the presence or absence of unreacted Sn or unreacted In in the solder paste samples.

TABLE 3

| | | First metal powder (wt %) | | | | | Second metal powder (wt %) | | Third metal powder (wt %) | | | Flux (wt %) | Unreacted Sn or unreacted In |
|---|---|---|---|---|---|---|---|---|---|---|---|---|---|
| | | Base metal (First metal material) | | | Second metal material | | | | | | | | |
| | | Ag | Au | Pd | Sn | In | Sn | In | Ag | Au | Pd | | |
| Example | 31 | 57.9 | — | — | 7.1 | — | 5.0 | — | 10.0 | — | — | 20.0 | Not observed |
| | 32 | 48.9 | — | — | 6.1 | — | 5.0 | — | 20.0 | — | — | 20.0 | Not observed |
| | 33 | 40.0 | — | — | 5.0 | — | 5.0 | — | 30.0 | — | — | 20.0 | Not observed |
| | 34 | 57.9 | — | — | — | 7.1 | — | 5.0 | 10.0 | — | — | 20.0 | Not observed |
| | 35 | 48.9 | — | — | — | 6.1 | — | 5.0 | 20.0 | — | — | 20.0 | Not observed |
| | 36 | 40.0 | — | — | — | 5.0 | — | 5.0 | 30.0 | — | — | 20.0 | Not observed |
| | 37 | — | 60.9 | — | 4.1 | — | 5.0 | — | — | 10.0 | — | 20.0 | Not observed |
| | 38 | — | 51.5 | — | 3.5 | — | 5.0 | — | — | 20.0 | — | 20.0 | Not observed |
| | 39 | — | 42.1 | — | 2.9 | — | 5.0 | — | — | 30.0 | — | 20.0 | Not observed |
| | 40 | — | 60.9 | — | — | 4.1 | — | 5.0 | — | 10.0 | — | 20.0 | Not observed |
| | 41 | — | 51.5 | — | — | 3.5 | — | 5.0 | — | 20.0 | — | 20.0 | Not observed |
| | 42 | — | 42.1 | — | — | 2.9 | — | 5.0 | — | 30.0 | — | 20.0 | Not observed |
| | 43 | — | — | 58.6 | 6.4 | — | 5.0 | — | — | — | 10.0 | 20.0 | Not observed |
| | 44 | — | — | 49.6 | 5.4 | — | 5.0 | — | — | — | 20.0 | 20.0 | Not observed |
| | 45 | — | — | 40.5 | 4.5 | — | 5.0 | — | — | — | 30.0 | 20.0 | Not observed |
| | 46 | — | — | 58.6 | — | 6.4 | — | 5.0 | — | — | 10.0 | 20.0 | Not observed |
| | 47 | — | — | 49.6 | — | 5.4 | — | 5.0 | — | — | 20.0 | 20.0 | Not observed |
| | 48 | — | — | 40.5 | — | 4.5 | — | 5.0 | — | — | 30.0 | 20.0 | Not observed |
| Comparative Example | 31 | 66.6 | — | — | 8.4 | — | 5.0 | — | — | — | — | 20.0 | Observed |
| | 32 | 66.6 | — | — | — | 8.4 | — | 5.0 | — | — | — | 20.0 | Observed |
| | 33 | — | 70.2 | — | 4.8 | — | 5.0 | — | — | — | — | 20.0 | Observed |
| | 34 | — | 70.2 | — | — | 4.8 | — | 5.0 | — | — | — | 20.0 | Observed |
| | 35 | — | — | 67.6 | 7.4 | — | 5.0 | — | — | — | — | 20.0 | Observed |
| | 36 | — | — | 67.6 | — | 7.4 | — | 5.0 | — | — | — | 20.0 | Observed |

TABLE 4

| | | First metal powder (wt %) | | | | Second metal powder (wt %) | | Third metal powder (wt %) | Flux | Unreacted Sn or |
|---|---|---|---|---|---|---|---|---|---|---|
| | | Base metal (First metal material) | | | Second metal material | | | | | |
| | | Cu—Ni | Ag—Cu | Ag—Pd | Sn | In | Sn | In | Cu | (wt %) | unreacted In |
| Example | 51 | 58.6 | — | — | 6.4 | — | 5.0 | — | 10.0 | 20.0 | Not observed |
| | 52 | 58.6 | — | — | — | — | — | 5.0 | 10.0 | 20.0 | Not observed |
| | 53 | — | 58.6 | — | 6.4 | — | 5.0 | — | 10.0 | 20.0 | Not observed |
| | 54 | — | 58.6 | — | — | 6.4 | — | 5.0 | 10.0 | 20.0 | Not observed |
| | 55 | — | — | 58.6 | 6.4 | — | 5.0 | — | 10.0 | 20.0 | Not observed |
| | 56 | — | — | 58.6 | — | 6.4 | — | 5.0 | 10.0 | 20.0 | Not observed |

As is apparent from Examples 51 to 56, it was also confirmed that when a base alloy was used as the first metal material, unreacted Sn or unreacted In did not remain after the reflow treatment as in the cases where a metal element such as Cu or Ag was used as the first metal material.

FIFTH EXAMPLE

Predetermined amounts of first to third metal powders having the same specifications as those in First Example were weighed. These powders were dispersed in a molten epoxy resin serving as a thermosetting resin with a three-roll mill, thus preparing solder paste samples of Examples 61 to 66. The mixing ratios of the first to third metal powders in Examples 61 to 66 were the same as those in Examples 1 to 6.

Subsequently, as in First Example, each of the solder paste samples was printed on a copper plate. A monolithic ceramic capacitor (length: 1.0 mm, width: 0.5 mm, thickness: 0.5 mm) was then mounted thereon. A reflow treatment was then performed in air for five minutes at a maximum temperature of 280° C., thereby bonding the copper plate to the monolithic ceramic capacitor with the solder.

Subsequently, additional samples of Examples 1 to 6 used in First Example were separately prepared. The mounted state of 20 samples of each of Examples 1 to 6 and Examples 61 to 66 was observed with a microscope. According to the results, the solder was exposed on the surface of the soldered portion in Examples 1 to 6 (see FIG. 2). On the other hand, it was confirmed that the solder layer was coated with the resin film in the soldered portion in Examples 61 to 66 (see FIG. 5).

Subsequently, the bonding strength was measured in accordance with Electronic Industries Association of Japan (EIAJ) ET-7403 using 20 samples of each of Examples 61 to 66 and Examples 1 to 6. More specifically, a lateral-push strength test was performed by pushing the monolithic ceramic capacitor in the horizontal direction at a rate of 0.05 mm/s.

Furthermore, a heat-cycle test was performed between −55° C. and 150° C. using 20 samples of each of Examples 61 to 66 and Examples 1 to 6. The cross section of each sample was observed with a scanning electron microscope (SEM) to check whether or not defects such as voids or cracks had been generated. In the heat-cycle test, each of the hold times at the minimum temperature (−55° C.) and the maximum temperature (150° C.) was 30 minutes, and the number of cycles was 500.

Table 5 shows the component compositions, the bonding strengths, and the defect generation rates in Examples 61 to 66 and Examples 1 to 6. In the table, the bonding strength is represented by the average in each example.

TABLE 5

| | | First metal powder (wt %) | | | Second metal material | | Second metal powder (wt %) | | Third metal powder (wt %) | Flux | Thermosetting resin | Bonding strength | Defect generation |
|---|---|---|---|---|---|---|---|---|---|---|---|---|---|
| | | Base metal (First metal material) | | | | | | | | | | | |
| | | Cu | Sn | In | Sn | In | Cu | (wt %) | (wt %) | (N/mm$^2$) | rate (%) |
| Example | 61 | 56.7 | 8.3 | — | 5.0 | — | 10.0 | — | 20.0 | 28.5 | 0.0 |
| | 62 | 48.0 | 7.0 | — | 5.0 | — | 20.0 | — | 20.0 | 27.7 | 0.0 |
| | 63 | 39.2 | 5.8 | — | 5.0 | — | 30.0 | — | 20.0 | 27.0 | 0.0 |
| | 64 | 56.7 | — | 8.3 | — | 5.0 | 10.0 | — | 20.0 | 27.5 | 0.0 |
| | 65 | 48.0 | — | 7.0 | — | 5.0 | 20.0 | — | 20.0 | 27.4 | 0.0 |
| | 66 | 39.2 | — | 5.8 | — | 5.0 | 30.0 | — | 20.0 | 27.7 | 0.0 |
| | 1 | 56.7 | 8.3 | — | 5.0 | — | 10.0 | 20.0 | — | 7.5 | 90.0 |
| | 2 | 48.0 | 7.0 | — | 5.0 | — | 20.0 | 20.0 | — | 7.4 | 95.0 |
| | 3 | 39.2 | 5.8 | — | 5.0 | — | 30.0 | 20.0 | — | 7.0 | 90.0 |
| | 4 | 56.7 | — | 8.3 | — | 5.0 | 10.0 | 20.0 | — | 7.1 | 100.0 |
| | 5 | 48.0 | — | 7.0 | — | 5.0 | 20.0 | 20.0 | — | 6.9 | 95.0 |
| | 6 | 39.2 | — | 5.8 | — | 5.0 | 30.0 | 20.0 | — | 7.5 | 100.0 |

As is apparent from Table 5, in the solder paste samples of Examples 1 to 6, which were prepared by dispersing the first to third metal powders in the flux, had bonding strength in the range of 6.9 to 7.5 N/mm$^2$, and voids or the like were observed in some samples. In contrast, the solder paste samples of Examples 61 to 66 were prepared by dispersing the first to third metal powders in the molten epoxy resin. Therefore, the outer surface of the bonded portion between the copper plate and the monolithic ceramic capacitor was composed of the resin film. Accordingly, the bonding strength was markedly increased to a value in the range of 27.0 to 28.5 N/mm², and voids or the like were not observed.

These results showed that the use of the solder paste prepared by dispersing the first to third metal powders in the molten epoxy resin could markedly improve the bonding strength and prevent the generation of voids or the like.

The invention claimed is:

1. Solder paste comprising:
a first metal powder comprising a first metal material having a surface coated with a second metal material which has a melting point lower than the melting point of the first metal material;
a second metal powder which has a melting point lower than the melting point of the first metal material; and
a third metal powder which has an average particle diameter which is smaller than the average particle diameter of the first metal material and which can form compounds with the second metal material and the second metal powder.

2. The solder paste according to claim 1,
wherein the first metal material and the third metal powder are individually selected from the group consisting of Cu, Ag, Au and Pd, and mixtures thereof, and
the second metal material and the second metal powder are individually selected from the group consisting of Sn and In.

3. The solder paste according to claim 2, wherein the average particle diameter of the third metal powder is in the range of 0.01 to 0.3 μm.

4. The solder paste according to claim 3, wherein the first metal material and the third metal powder comprise the same metal.

5. The solder paste according to claim 4, wherein the second metal material and the second metal powder comprise the same metal.

6. The solder paste according to claim 5, wherein the first metal powder, the second metal powder and the third metal powder are dispersed in a flux.

7. The solder paste according to claim 5, wherein the first metal powder, the second metal powder and the third metal powder are dispersed in a thermosetting resin.

8. The solder paste according to claim 1, wherein the average particle diameter of the third metal powder is in the range of 0.01 to 0.3 μm.

9. The solder paste according to claim 1, wherein the first metal material and the third metal powder comprise the same metal.

10. The solder paste according to claim 1, wherein the second metal material and the second metal powder comprise the same metal.

11. The solder paste according to claim 1, wherein the first metal powder, the second metal powder and the third metal powder are dispersed in a flux.

12. The solder paste according to claim 1, wherein the first metal powder, the second metal powder and the third metal powder are dispersed in a thermosetting resin.

13. An electronic device comprising a first electronic component electrically connected to a second electronic component by a heated solder paste according to claim 12.

14. An electronic device comprising a first electronic component electrically connected to a second electronic component by a heated solder paste according to claim 11.

15. An electronic device comprising a first electronic component electrically connected to a second electronic component by a heated solder paste according to claim 10.

16. An electronic device comprising a first electronic component electrically connected to a second electronic component by a heated solder paste according to claim 9.

17. An electronic device comprising a first electronic component electrically connected to a second electronic component by a heated solder paste according to claim 8.

18. An electronic device comprising a first electronic component electrically connected to a second electronic component by a heated solder paste according to claim 7.

19. An electronic device comprising a first electronic component electrically connected to a second electronic component by a heated solder paste according to claim 6.

20. An electronic device comprising a first electronic component electrically connected to a second electronic component by a heated solder paste according to claim 1.

* * * * *